(12) United States Patent
Ganga et al.

(10) Patent No.: US 8,307,265 B2
(45) Date of Patent: Nov. 6, 2012

(54) INTERCONNECTION TECHNIQUES

(75) Inventors: Ilango Ganga, Cupertino, CA (US); Richard Mellitz, Prosperity, SC (US)

(73) Assignee: Intel Corporation, Santa Clara, CA (US)

( * ) Notice: Subject to any disclaimer, the term of this patent is extended or adjusted under 35 U.S.C. 154(b) by 859 days.

(21) Appl. No.: 12/381,205

(22) Filed: Mar. 9, 2009

(65) Prior Publication Data

US 2010/0229071 A1    Sep. 9, 2010

(51) Int. Cl.
*H03M 13/00* (2006.01)

(52) U.S. Cl. ........ 714/776; 714/752; 370/470; 370/510; 370/536

(58) Field of Classification Search ................... 714/776, 714/752; 370/470, 510, 536
See application file for complete search history.

(56) References Cited

U.S. PATENT DOCUMENTS

| | | | |
|---|---|---|---|
| 4,860,283 A * | 8/1989 | Takano et al. | 370/470 |
| 5,491,565 A * | 2/1996 | Naper | 358/468 |
| 5,627,836 A | 5/1997 | Conoscenti et al. | |
| 5,805,597 A | 9/1998 | Edem | |
| 5,889,776 A | 3/1999 | Liang | |
| 5,907,553 A | 5/1999 | Kelly et al. | |
| 5,930,015 A * | 7/1999 | Yamamoto et al. | 398/71 |
| 6,169,729 B1 | 1/2001 | Feuerstraeter | |
| 6,198,727 B1 | 3/2001 | Wakeley et al. | |
| 6,201,654 B1 * | 3/2001 | Okamoto et al. | 360/48 |
| 6,215,184 B1 | 4/2001 | Stearns et al. | |
| 6,215,816 B1 * | 4/2001 | Gillespie et al. | 375/219 |
| 6,222,852 B1 | 4/2001 | Gandy | |
| 6,345,345 B1 | 2/2002 | Yu et al. | |
| 6,349,331 B1 | 2/2002 | Andra et al. | |
| 6,359,893 B1 | 3/2002 | Mills | |
| 7,284,184 B2 | 10/2007 | Gallezot et al. | |
| 7,343,540 B2 | 3/2008 | Khermosh et al. | |
| 7,499,500 B2 | 3/2009 | Page | |
| 7,835,389 B2 | 11/2010 | Yu et al. | |
| 2001/0009533 A1 | 7/2001 | Baroche | |
| 2001/0009553 A1 | 7/2001 | Homann | |
| 2001/0034729 A1 | 10/2001 | Azadet et al. | |
| 2002/0091884 A1 | 7/2002 | Chang et al. | |
| 2002/0123365 A1 | 9/2002 | Thorson et al. | |
| 2004/0001579 A1 | 1/2004 | Feinberg et al. | |
| 2004/0091027 A1 | 5/2004 | Booth | |
| 2004/0233981 A1 | 11/2004 | Porter et al. | |

(Continued)

FOREIGN PATENT DOCUMENTS

JP    10-304004 A    11/1998

(Continued)

OTHER PUBLICATIONS

NN9207223, "High Speed Bus," IBM Technical Disclosure Bulletin, vol. # 35, Issue # 2, Pertinent pp. 223-224, Jul. 1992.*

(Continued)

*Primary Examiner* — Guy Lamarre
(74) *Attorney, Agent, or Firm* — Glen B. Choi

(57) ABSTRACT

Techniques are described that can be used to extend the data transmission rate specified by 10GBASE-KR of IEEE 802.3ap (2007) to more than 10 Gb/s using a multiple lane backplane. A signal for transmission over 10 Gb/s can be divided into multiple streams for transmission over multiple lanes. Multiple transceiver pairs can be used for transmission and receipt of the multiple streams. Each transceiver pair may comply with 10GBASE-KR of IEEE 802.3ap (2007).

32 Claims, 13 Drawing Sheets

U.S. PATENT DOCUMENTS

| | | | |
|---|---|---|---|
| 2004/0247313 | A1 | 12/2004 | Tanaka |
| 2005/0111531 | A1 | 5/2005 | Booth et al. |
| 2005/0149822 | A1 | 7/2005 | Lee et al. |
| 2006/0098686 | A1 | 5/2006 | Takakuwa et al. |
| 2007/0157060 | A1 | 7/2007 | Ganga et al. |
| 2008/0244100 | A1* | 10/2008 | Uddenberg et al. .............. 710/8 |
| 2009/0219978 | A1 | 9/2009 | Mobin et al. |

FOREIGN PATENT DOCUMENTS

| | | |
|---|---|---|
| JP | 2003-087261 A | 3/2003 |
| JP | 2003-87276 A | 3/2003 |
| TW | I236237 | 7/2005 |
| WO | 0147184 A2 | 6/2001 |
| WO | 200404518 A1 | 1/2004 |
| WO | 2005091569 A1 | 9/2005 |

OTHER PUBLICATIONS

Office Action received for U.S. Appl. No. 10/291,017, mailed May 9, 2006, 23 pages.

Office Action received for U.S. Appl. No. 10/291,017, mailed Aug. 4, 2008, 22 pages.

Office Action received for U.S. Appl. No. 10/291,017, mailed Nov. 1, 2006, 19 pages.

Office Action received for U.S. Appl. No. 10/291,017, mailed Feb. 3, 2009, 25 pages.

Office Action received for U.S. Appl. No. 10/801,504, mailed May 29, 2007, 24 pages.

Office Action received for U.S. Appl. No. 10/801,504, mailed Mar. 31, 2008, 19 pages.

Office Action received for U.S. Appl. No. 10/801,504, mailed Dec. 11, 2007, 18 pages.

Office Action received for U.S. Appl. No. 10/801,504, mailed Dec. 9, 2008, 25 pages.

Richard Mellitz, "40 GbE Over 4-lane 802.3ap Compliant Backplane", IEEE 802.3 HSSG, Nov. 2007, 11 pages.

Richard Mellitz, "IEEE 802.3ap (or 10GBASE-KR) Jitter Spec is Inclusive of Package Crosstalk and is Sufficient for IEEE 802.3ba Systems", IEEE 802.3ba Interim, Jan. 2008, 8 pages.

Ilango Ganga, "40/100G Architecture & Interfaces proposal", IEEE 802.3ba Interim meeting, Portland, OR, Jan. 23, 2008, 9 pages.

Chris Cole, "Nx10G Electrical I/O Issues", IEEE 802.3 Higher Speed Study Group, Finisar, Nov. 12-15, 2007, 13 pages.

"Part 3: Carrier Sense Multiple Access with Collision Detection (CSMA/CD) Access Method and Physical Layer Specifications", Draft Amendment to IEEE Std 802.3-2008 IEEE 802.3ba 40Gb/s and 100Gb/s Ethernet Task Force, Draft Standard for Information technology—Telecommunications and information exchange between systems—Local and metropolitan area networks—Specific requirements, IEEE P802.3ba™/D1.1, Dec. 9, 2008, 366 pages.

"Part 3: Carrier Sense Multiple Access with Collision Detection (CSMA/CD) Access Method and Physical Layer Specifications", Amendment 4: Ethernet Operation over Electrical Backplanes, IEEE Standard for Information technology—Telecommunications and information exchange between systems—Local and metropolitan area networks—Specific requirements, IEEE Std 802.3ap™, May 22, 2007, 203 pages.

Office Action Received for Japanese Patent Application No. 2007-504035, mailed on May 12, 2009, 4 pages, including 2 pages of English translation.

International Search Report for PCT Patent Application No. PCT/US 2003/034160, mailed on Jul. 27, 2014, 8 pages.

International Preliminary Report on Patentability issued in PCT Patent Application No. PCT/US2005/008607, mailed on Sep. 28, 2006, 9 pages.

Chinese Office Action received for Chinese Patent Application No. 200580005349.3, maied on Mar. 14, 2008, 30 Pages, including 19 pages of English translation.

International Search Report and Written Opinion issued in PCT Patent Application No. PCT/US 2005/008607, Jun. 10, 2010, 14 Pages.

Baek et al., "Increased Radiation Emission and Impedance Change by Edge Placement of High-Speed Differential Lines on Printed Circuit Board", IEEE International Symposium on Electromagnetic Compatibility, Aug. 19, 2002, pp. 200-204.

Lund et al., "Going Serial in Gigabit Ethernet Designs". Broadcom Corp., Comms Design. Com dated Jun. 20, 2002. Retrived from the http://www.commsdesign.com/story/OEG2002,062050004, 7 pages.

Office Action Received for Taiwanese Patent Application No. 092131067, mailed Dec. 17, 2004, 3 pages, including 1 page of English translation.

Office Action for European Patent Application No. 03779361.9, mailed Nov. 6, 2007, 9 pages.

Notice of Allowance Received for Taiwan Patent Application No. 09231067, mailed May 9, 2005, 5 pages, including 3 pages of English translation.

Office Action Received for U.S. Appl. No. 12/381,282, mailed on Sep. 30, 2011, 14 pages.

Ganga, Ilango, "Considerations for 40G Backplane Ethernet PHY",Intel, IEEE 802.3 Higher Speed Study Group, Sep. 12, 2007, pp. 1-11.

Szczepanek et al., "10GBASE-KR FEC Tutorial", IEEE 802 Plenary Jul. 2006, pp. 1-87.

Hankins, Greg, "IEEE P802.3ba 40 GbE and 100 GbE Standards Update", NANOG 44, Oct. 13, 2008, pp. 1-24.

"IEEE Draft P802.3ap/Draft 3.0", Jul. 25, 2006, pp. 162-183.

Office Action received U.S. Appl. No. 12/381,194, mailed on Mar. 28, 2012, 13 pages.

* cited by examiner

US 8,307,265 B2

INTERCONNECTION TECHNIQUES

RELATED APPLICATIONS

This application is related to U.S. patent application Ser. No. 12/381,194, entitled "Cable Interconnection Techniques," filed Mar. 9, 2009, inventors Ganga and Mellitz and incorporates by reference the contents of that application in its entirety.

FIELD

The subject matter disclosed herein relates generally to electrical backplane interconnects.

RELATED ART

A backplane is a physical interface module that interconnects various components of a network device. Ethernet is a common standard used for communication over backplanes. For example, IEEE Std 802.3ap-2007 defines three PHYs for backplanes: 1000 BASE-KX, a 1-lane 1 Gb/s PHY at clause 70; 10 GBASE-KX4, a 4-lane 10 Gb/s PHY at clause 71; and 10 GBASE-KR, a 1-lane 10 Gb/s PHY at clause 72.

Evolving data transmission speeds are increasing the data transmission rates over backplanes. A next generation Ethernet standard is being developed by IEEE 802.3 for specifying Ethernet at speeds of 40 Gb/s and 100 Gb/s over different physical medium including backplane, copper, and optical fiber. What are needed are techniques for Ethernet operation using a backplane medium that support increasing transmission speeds.

BRIEF DESCRIPTION OF THE DRAWINGS

Embodiments of the present invention are illustrated by way of example, and not by way of limitation, in the drawings and in which like reference numerals refer to similar elements.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Figure 1A:
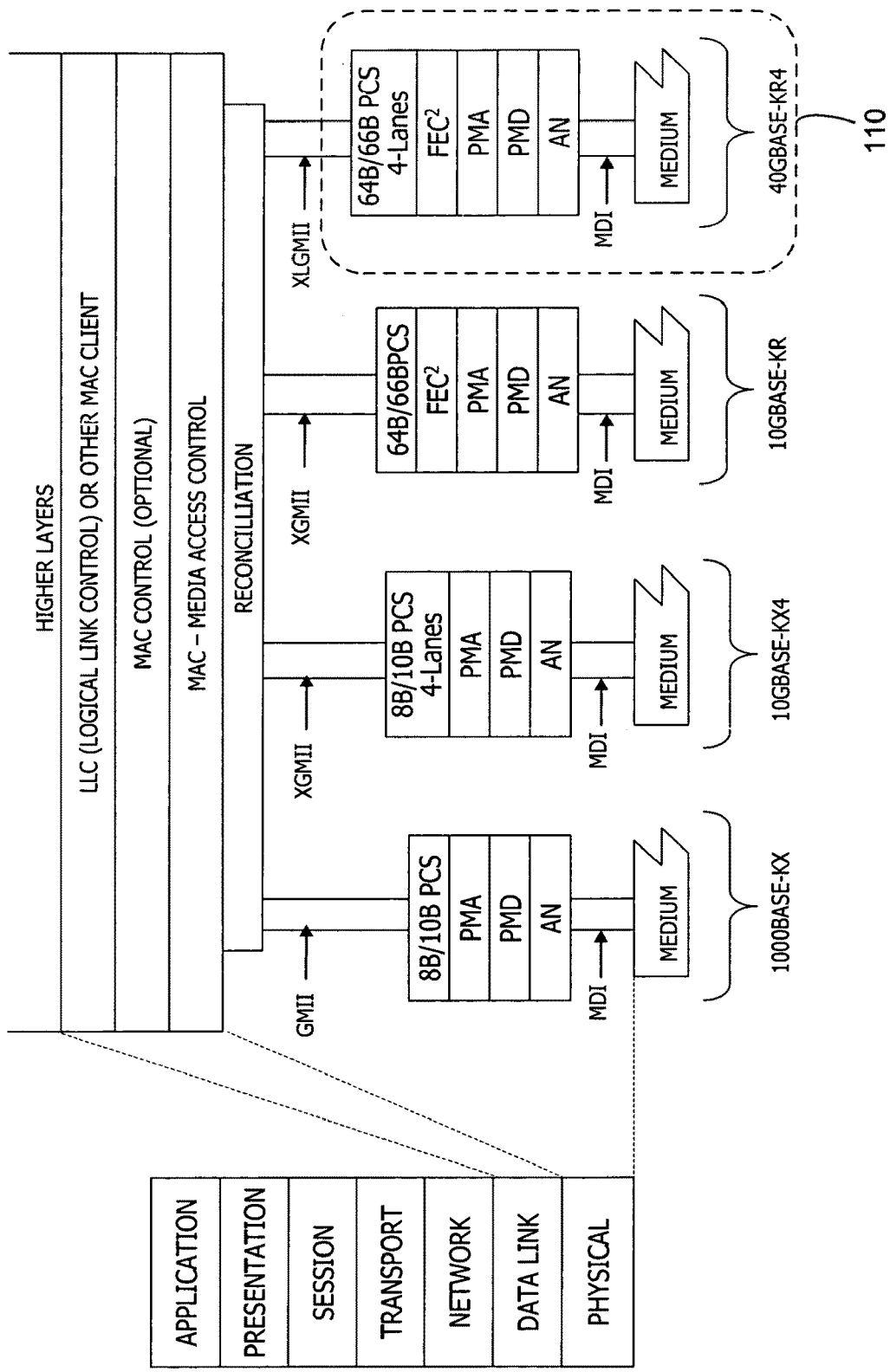
FIG. 1A provides the layer diagram and architecture for a backplane PHY, in accordance with an embodiment.

FIG. 1A provides the layer diagram and architecture for a backplane PHY, in accordance with an embodiment. The PHY stack 110 provides the capability to transmit and receive data each at 40 Gb/s using multiple lanes. In some embodiments, each lane complies with the backplane Ethernet framework defined with regard to 10 GBASE-KR of IEEE 802.3ap (2007). 10 GBASE-KR of IEEE 802.3ap (2007) defines operation for 10 Gb/s Ethernet over a single lane. Various embodiments provide operation of 40 Gb/s over four lanes, each lane operating at a signaling rate of 10.3125 Gbaud. The four lanes include four separate pairs in a transmit direction and four separate pairs in a receive direction, constituting a single full duplex link. The examples described herein are with regard to four lanes. However, to support link rates other than 40 Gb/s, other numbers of lanes can be used.

The techniques described herein can be used to comply with the evolving 40 GBASE-KR4 standard described in the evolving IEEE P802.3ba standard.

An advantage of extending 10 Gb/s Ethernet over a single lane to multiple lanes is the ability to extend existing deployed backplane systems to transport at least four times the bandwidth of data across blades or line cards.

Applying 10 GBASE-KR of IEEE 802.3ap (2007) across multiple lanes has been thought to cause cross-talk between lanes, which can lead to unacceptable bit error rates. For example, slide 10 of Cole, "Nx10G Electrical I/O Issues," IEEE 802.3 Higher Speed Study Group (November 2007) indicates that cross talk from multiple lanes may lead to unacceptable performance. However, embodiments described herein may exhibit acceptable bit error rates when applying 10 GBASE-KR of IEEE 802.3ap (2007) across multiple lanes.

Figure 1B:
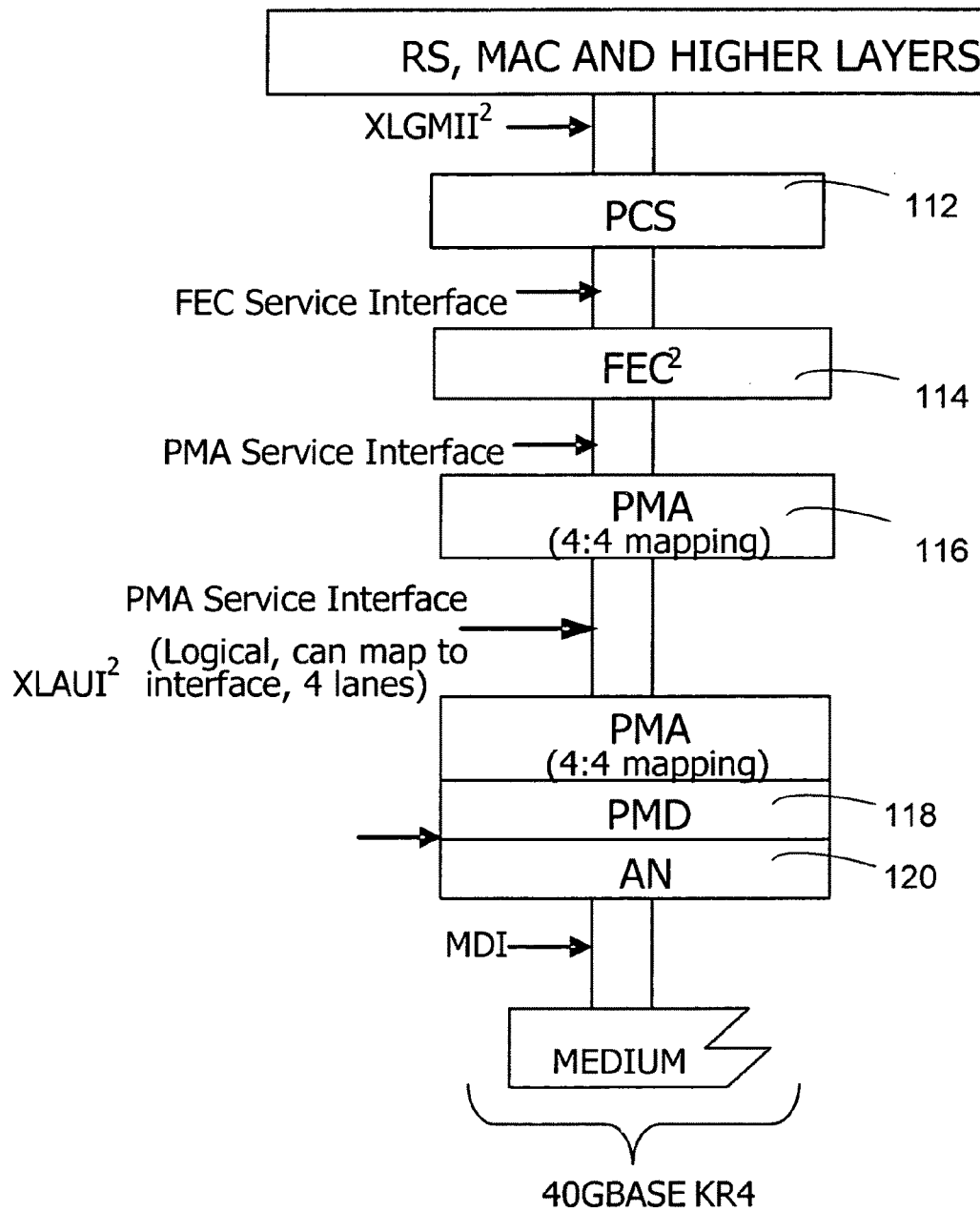
FIG. 1B provides a layer diagram and architecture for a 40 Gb/s backplane PHY stack, in accordance with an embodiment.

FIG. 1B provides a layer diagram and architecture for a 40 Gb/s backplane PHY stack, in accordance with an embodiment. In this embodiment, an intra-chip interconnect called XLGMII (40G Media independent interface) may communicatively couple the 40 Gb/s MAC to the 40 Gb/s PHY stack 110. In other embodiments, an intra-chip interconnect may not be used and instead the layers may be implemented using the same chip. Speeds other than 40 Gb/s can be supported, such as but not limited to 100 Gb/s.

PCS 112 provides 64B/66B encoding, lane distribution and alignment. For 40 Gb/s operation, PCS 112 distributes encoded 64B/66B data streams over four lanes with FEC 114. PCS sublayer 112 may interface with FEC sublayer 114 in a manner consistent with clause 74 of IEEE 802.3ap (2007). For 40 Gb/s operation, FEC 114, PMA 116, and PMD 118 sublayers process signals transmitted over four lanes at 10.3125 Gb/s per lane. Except as described herein, operations of sublayers PCS 112, FEC 114, PMA 116, and PMD 118 comply with 10 GBASE-KR of IEEE 802.3ap (2007) except that each sublayer includes the capability to process signals from multiple lanes.

FEC sublayer 114 may perform forward error correction in compliance with 10 GBASE-KR, namely clause 74 of IEEE 802.3ap (2007). FEC sublayer 114 may transparently pass 64B/66B code blocks. In some embodiments, transmit and receive FEC functions may be modified to operate with multiple bit streams of 64B/66B encoded code blocks. FEC sublayer 114 may be adapted to accommodate FEC synchronization for four lanes. FEC synchronization is applied to each lane to compare 64/66B code blocks with parity check. Synchronization on lanes may occur asynchronously. FEC sublayer 114 may use the same state diagram for FEC block lock as described with regard to clause 74 for each lane. FEC sublayer 114 may report Global Sync achieved when all lanes are locked.

Data transmitted over multiple lanes might suffer different delays on each lane. Accordingly, four bits (e.g., bit0, bit1, bit2, and bit3) transmitted over four different lanes may arrive at different instances in time at the receiver. FEC frame markers can be used for signals transmitted on each of the lanes. FEC sublayer 114 may use the FEC frame markers to align data transmitted on different lanes so that data on all lanes are available for processing at the same time. The FEC frame marker can be a Word 0 (T0), the start of an FEC block, shown in Table 74-1 of IEEE 802.3ap (2007).

The FEC sync signal can also be used for lane alignment purposes. Because the data stream passes through the four lanes independent of one another, these lanes are to be deskewed and aligned at the receiver. The FEC block sync method can be used to align the lanes as long as the lane skew is within 32 64B/66B blocks (or 32 clock cycles).

FEC sublayer 114 may use a shortened cyclic code (2112, 2080) for error checking and forward error correction described in patent application Ser. No. 11/325,765, entitled "Techniques to Perform Forward Error Correction for an Electrical Backplane," filed Jan. 4, 2006 (attorney docket no. P23103) with the following modifications. For 40 GBASE-KR4, the FEC encoding and decoding is performed on a per lane basis on all the four lanes. The 64B/66B encoded data on each lane is passed to the FEC encoding functions which then converts the data to (2112, 2080) code blocks. The FEC code blocks are then serialized on each of the PMA or PMD lanes downstream.

On the receive direction, FEC sublayer 114 performs FEC block sync independently on each of the four lanes. The FEC sync is reported to PCS sublayer 114 if all four lanes report block sync. PCS sublayer 112 may not sync to the data until the FEC sublayer 114 indicates link sync.

The following table enumerates MDIO/FEC variable mapping with counters for FEC corrected and uncorrectable errors for each lane.

| MDIO variable | PMA/PMD register name | Register/bit number | FEC variable |
|---|---|---|---|
| 10GBASE-R FEC ability | 10GBASE-R FEC ability register | 1.170.0 | FEC_ability |
| 10GBASE-R error indication ability | 10GBASE-R FEC ability register | 1.170.1 | FEC_Error_Indication_ability |
| FEC Enable | 10GBASE-R FEC control register | 1.171.0 | FEC_Enable |
| FEC Enable Error Indication | 10GBASE-R FEC control register | 1.171.1 | FEC_Enable_Error_to_PCS |
| FEC corrected blocks | 10GBASE-R FEC corrected blocks counter register | 1.172, 1.173 | FEC_corrected_blocks_counter |
| FEC uncorrected blocks | 10GBASE-R FEC uncorrected blocks counter register | 1.174, 1.175 | FEC_uncorrected_blocks_counter |

The FEC_Enable enable or disables FEC operation for all lanes simultaneously. FEC_enable_Error_to_PCS enables error indication on all lanes going to PCS.

In some embodiments, FEC Error indication is made by indicating error through sync bits to the PCS layer. In clause 74.7.4.5.1 of IEEE 802.3ap (2007), the error was indicated by marking every eighth 64B/66B block sync bits (e.g., bits 1, 9, 17, 25, and 32) in an FEC block (or FEC frame). The error was not indicated in each 64B/66B block sync bits because this may cause the PCS to go out of sync even during low error conditions. This method will work with a single lane case, as in 10 GBASE-KR, however the same technique will not work if it is applied to a multi lane case as in 40 GBASE-R or 100 GBASE-R.

For a 40 Gb/s case, 64B/66B data is distributed over multiple lanes (e.g., four lanes), at least every alternate 64B/66B block sync bits are marked with error (e.g., bits 1, 3, 5, 7, and so on) on each FEC lane going to the PCS.

For 100 Gb/s case, all 64B/66B block sync bits are marked with error because it is distributed over 20 virtual lanes. Note that for a 40 Gb/s case, for all lanes, marking all 64B/66B sync bits in an FEC block can occur as well. This technique is unique to multilane operation of FEC. The multilane marking cannot be used with single lane 10 Gb/s case because the marking each 64B/66B will cause the 10 G PCS to go out of sync and will significantly magnify the actual error condition on the wire. Accordingly, single lane FEC error indication as defined in clause 74 in 802.3ap (2007) does not work in a multi-lane operation. When PCS blocks are distributed over multiple lanes (4 or 20 lanes), the error marking also gets distributed over multiple lanes and accordingly error marking density needs to be increased when 10 GBASE-KR FEC is used with 40 Gbps and 100 Gbps. For 40 Gbps, a minimum of every other location is to be marked with error and for 100 Gbps, every location is to be marked with error.

If a multiplexing function is used at PMA sublayer 116, the data stream may be demultiplexed and virtual lanes could be recovered before sending it to FEC sublayer 114 for processing. The 64B/66B blocks may be recovered by the reverse gearbox function within the FEC sublayer. On the transmit direction, PMA sublayer 116 may multiplex virtual lanes from the FEC sublayer 114 to physical lanes. Virtual to physical lane translation and vice versa can be accomplished in accordance with "100 GE and 40 GE PCS (MLD) Proposal," IEEE 802.ba (May 2008).

PMD 118 complies with clause 72 of 10 GBASE-KR with the following changes for multiple lane operation to support 40 Gb/s signal transmission. The PMD service interface is extended to support four logical streams (i.e., tx_bit0-tx_bit3, rx_bit0-rx_bit3, and signal_detect0-signal_detect3). The PMD control variable mapping table is extended to include management variables for four lanes (e.g., transmit disable register and PMD signal detect). The four logical streams are described in more detail with respect to FIG. 2. PMD 118 complies with clause 72 of 10 GBASE-KR for startup and training modes to tune equalizer settings for optimum backplane performance. PMD 118 uses the frame lock state diagram from FIG. 72-4 and the training state diagram from FIG. 72-5 with enumeration of variables corresponding to four lanes. In addition, management registers for coefficient update field and status report field described in clause 72 are extended for four lanes. The coefficient update state machine described in FIG. 72-6 may be used for each lane.

PMD 118 provides link training to dynamically adjust the transmit equalizer settings for optimum link performance. For example, techniques described with regard to the 10 GBASE-KR PMD control function as defined in clause 72.6.10 of IEEE Std 802.3ap-2007 can be used to adjust transmit equalizer settings for each lane.

PMD 118 uses the 10 GBASE-KR control function and training mechanism with the following modifications. The control function is implemented on transmitters/receivers of all four lanes. The training protocol starts on all four lanes after the completion of the AN process and runs simultaneously on all lanes during link initialization. The four transmitters are independently trained using the respective training state-machines implemented by the 40 G PHYs at both end of the link. In addition, the training frame is the PRBS11 training pattern with the patterns being random across the four lanes.

PMD 118 may track lane by lane transmit disable as well as global transmit disable. In addition, PMD 118 may track signal detect lane by lane in addition to global signal detect. The following table describes PMD MDIO control variable mapping for management variables. New variables transmit_disable_0 to transmit_disable_3 are added to control transmitter disable for each of respective lanes 0 to 3. These signals are used in the transmit direction to enable or disable a transmitter.

| MDIO variable | PMA/PMD register name | PMD control variable |
|---|---|---|
| Reset | Control register 1 | PMD_reset |
| Global Transmit Disable | Transmit disable register | Global_PMD_transmit_disable |
| Transmit disable 3 | Transmit disable register | PMD_transmit_disable_3 |
| Transmit disable 2 | Transmit disable register | PMD_transmit_disable_2 |
| Transmit disable 1 | Transmit disable register | PMD_transmit_disable_1 |
| Transmit disable 0 | Transmit disable register | PMD_transmit_disable_0 |
| Restart training | PMD control register | mr_restart_training |
| Training enable | PMD control register | mr_training_enable |

The PHY implements a transmit disable function on each of the four lanes so transmitters on each lane can be separately turned on or off using this function. The link also implements a global transmit disable function to disable all four lanes on the link together.

The following table provides MDIO/PMD status variable mapping. Management variables for four lanes are provided. Lane by lane signal detect and status indication per lane are supported. Newly added bits PMD_signal_detect_0 to PMD_signal_detect_3 are used to indicate presence of signals on respective lanes 0 to 3. These signals are used to indicate a signal presence on each of the lanes on the link. A signal detect means successful completion of startup protocol on a particular lane. Global signal detect is asserted if signal detect is asserted for each of the lanes.

| MDIO status variable | PMA/PMD register name | PMD control variable |
|---|---|---|
| Fault | Status register 1 | PMD_fault |
| Transmit fault | Status register 2 | PMD_transmit_fault |
| Receive fault | Status register 3 | PMD_receive_fault |
| Global PMD Receive signal detect | Receive signal detect register | Global_PMD_signal_detect |
| PMD signal detect 3 | Receive signal detect register | PMD_signal_detect_3 |
| PMD signal detect 2 | Receive signal detect register | PMD_signal_detect_2 |
| PMD signal detect 1 | Receive signal detect register | PMD_signal_detect_1 |
| PMD signal detect 0 | Receive signal detect register | PMD_signal_detect_0 |
| Receiver status | PMD status register | rx_trained |
| Frame lock | PMD status register | frame_lock |

-continued

| MDIO status variable | PMA/PMD register name | PMD control variable |
|---|---|---|
| Start-up protocol status | PMD status register | training |
| Training failure | PMD status register | training_failure |

The last four rows of the table are enumerated for all lanes. Accordingly for a four lane system, the variables in the last four rows may be as follows: Receiver Status) to Receiver Status 3, Frame lock0 to Frame lock3, Startup protocol status0 to Startup protocol status3, and Training failure0 to Training failure3.

A signal detect function may be implemented on a per lane basis. Individual lane by lane signal detect (a logical signal) is indicated upon successful completion of training on each link. The Global Link signal detect function is implemented at the link level and is reported if all the four links are successfully trained. The Global link signal detect will not be asserted even if one of the link is not trained properly. The signal detect status is indicated through management variables implemented in the PHY device. The control registers for exchanging control coefficients and status may be enumerated for each of the four lanes.

Auto-Negotiation (AN) sublayer 120 applies auto-negotiation in compliance with clause 73 of the IEEE 802.3ap specification with the following modifications. For 40 Gb/s operation, because there are four lanes on the backplane, the AN protocol is run on a single lane, e.g., lane 0, of the MDI and the other lanes do not run this protocol during AN phase. AN sublayer 120 may use DME signaling with 48-bit base pages to exchange link partner abilities, IEEE Std 802.3ap management register format, and the ability to negotiate FEC. FEC may be selected to be enabled on all lanes after FEC is negotiated on a single lane. AN sublayer 120 supports the AN_LINK.indication primitive of clause 73 and uses associated multilane PCS to support this primitive. For example, this primitive may be implemented as an out of band signal.

The following table depicts technology ability bits and their uses in accordance with various embodiments.

| Bit | Technology |
|---|---|
| A0 | 1000BASE-KX |
| A1 | 10GBASE-KX4 |
| A2 | 10GBASE-KR |
| A3 | 40GBASE-KR4 |
| A4-A24 | Reserved |

In accordance with an embodiment, bit A3 in the base page of an AN frame is defined to advertise the 40 Gb/s backplane PHY ability. Both link partners may use the A3 bit to advertise the 40 Gb/s backplane ability. The priority resolution detects the 40 GBASE-KR4 capability and initializes the link with the highest common denominator. For example, if the PHY at both ends have 1 G/10 G/40 G capability, then the link is brought up with a 40 Gb/s PHY stack. Auto-negotiation allows plug and play configuration of the 40 G PHYs and backward compatibility with existing 1 G and 10 G backplane PHYs.

Figure 2:
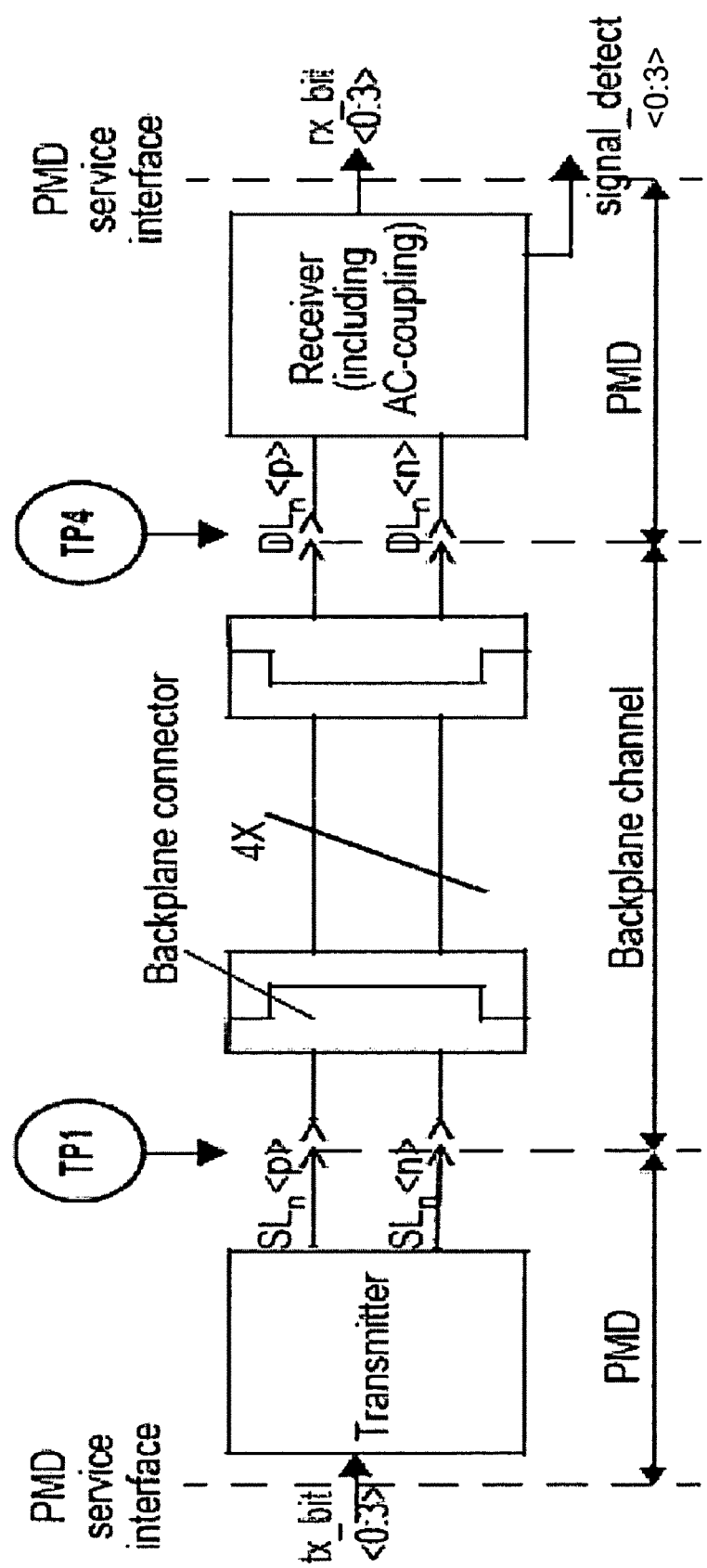
FIG. 2 illustrates a link diagram for a 40 Gb/s backplane link, in accordance with an embodiment.

FIG. 2 illustrates a link diagram for a 40 Gb/s backplane link, in accordance with an embodiment. The backplane may interface with a four-lane backplane medium by complying with interconnect characteristics recommended in clause 72 of 10 GBASE-KR and annex 69B of IEEE standard 802.3ap (2007).

Each lane may comply with the startup protocol per lane, signaling speed (e.g., 10.3125 Gb/s), electrical characteristics, and test methodology and procedures in clause 72 and annex 69A of IEEE standard 802.3ap (2007). PMD Service Interface may use the service interface definition as in clause 72 and annex 69A with logical streams of 64B/66B code groups from a PMA with the modifications explained below. The logical streams transmitted between transmitter and receiver include txbit<0:3>, rxbit<0:3>, and SIGNAL_DETECT<0:3>.

Figure 3:
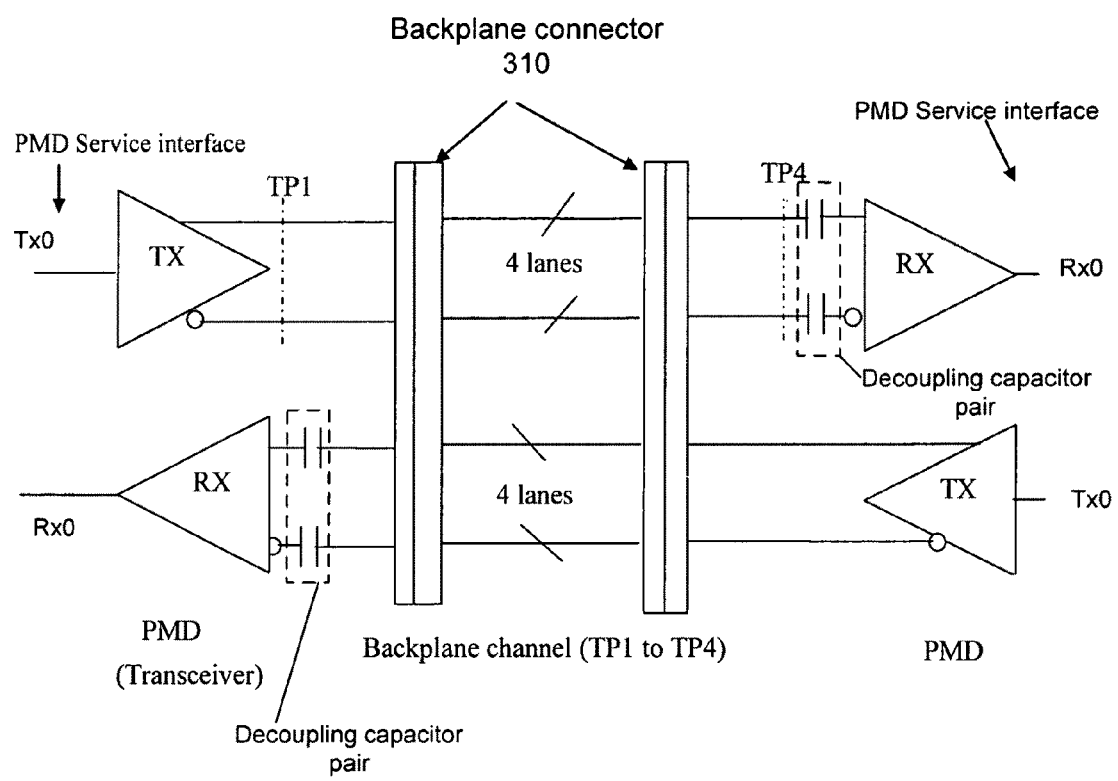
FIG. 3 depicts a transceiver coupling to a backplane channel, in accordance with an embodiment.

FIG. 3 depicts a transceiver coupling to a backplane channel, in accordance with an embodiment. This example shows the coupling of a single pair of transceivers using a backplane connector 310. Backplane connector 310 supports at least four couplings. The transceiver coupling is depicted for a single bidirectional coupling. For 40 Gb/s operation, the transceiver is replicated four times for each of the transmit and receive bits.

The signaling used is differential NRZ signaling. The signaling rate on the wire is 10.3125 Gb/s operating over four differential pairs each on transmit and receive direction as illustrated.

The transmitters couple directly to the backplane medium. On the receive direction a decoupling capacitor decouples the transmitter from the receiver. Decoupling capacitor provides DC isolation. Test points T1 and T4 follow the electrical characteristics of clause 72 of 10 GBASE-KR.

Figure 4:
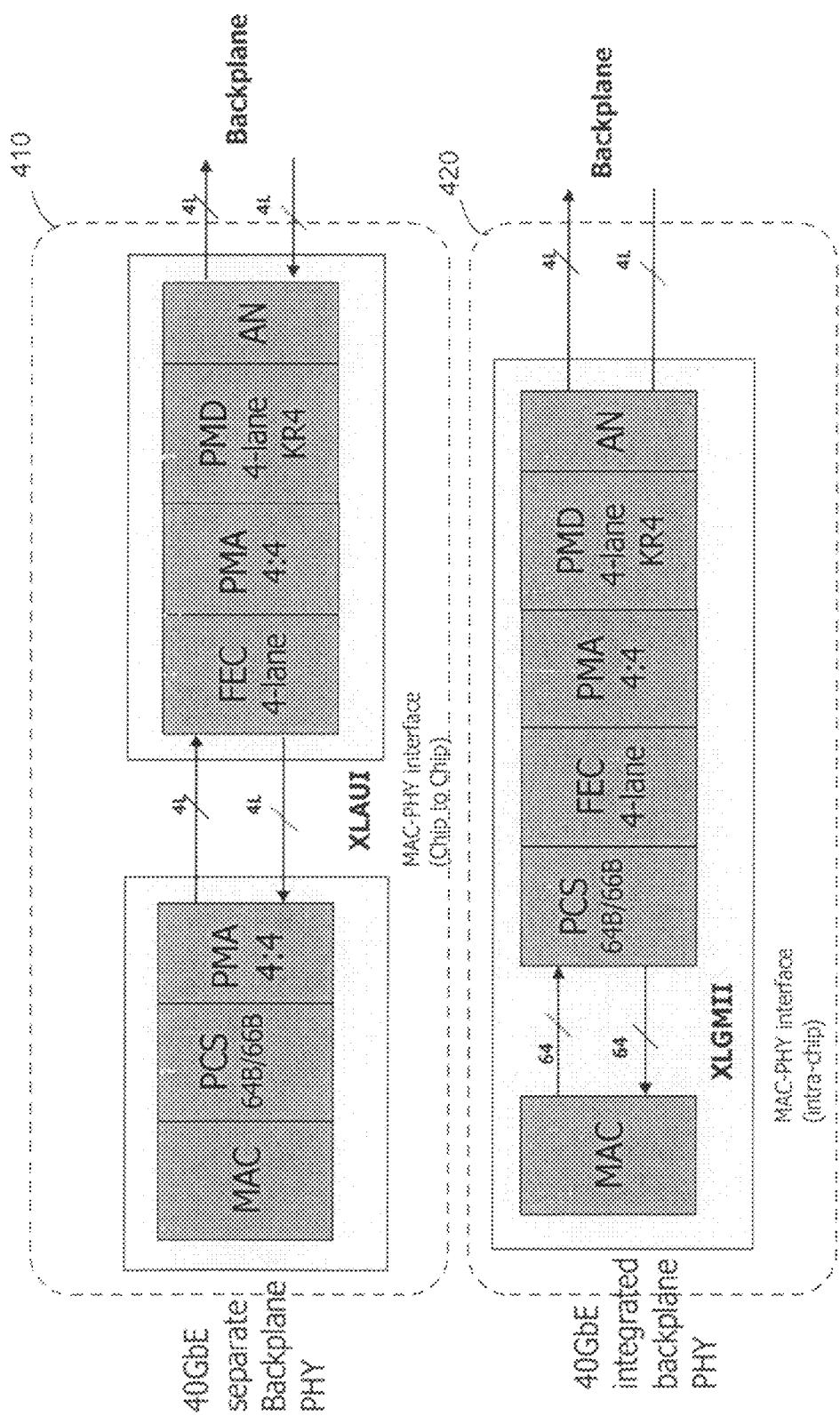
FIG. 4 depicts example implementations of 40 Gb/s backplane PHYs as well as interconnection to other system components, in accordance with embodiments of the present invention.

FIG. 4 depicts example implementations of 40 Gb/s backplane PHYs as well as interconnection to other system components, in accordance with embodiments of the present invention. System 410 depicts a MAC device connected to a PHY chip using a four lane XLAUI chip-to-chip interconnect. This XLAUI interface allows having separate implementation of MAC/PCS layers from the rest of the PHY layers (implemented in a separate PHY chip). System 420 uses a 64 bit interface XLGMII interface to interconnect a MAC with a PHY.

Figure 5:
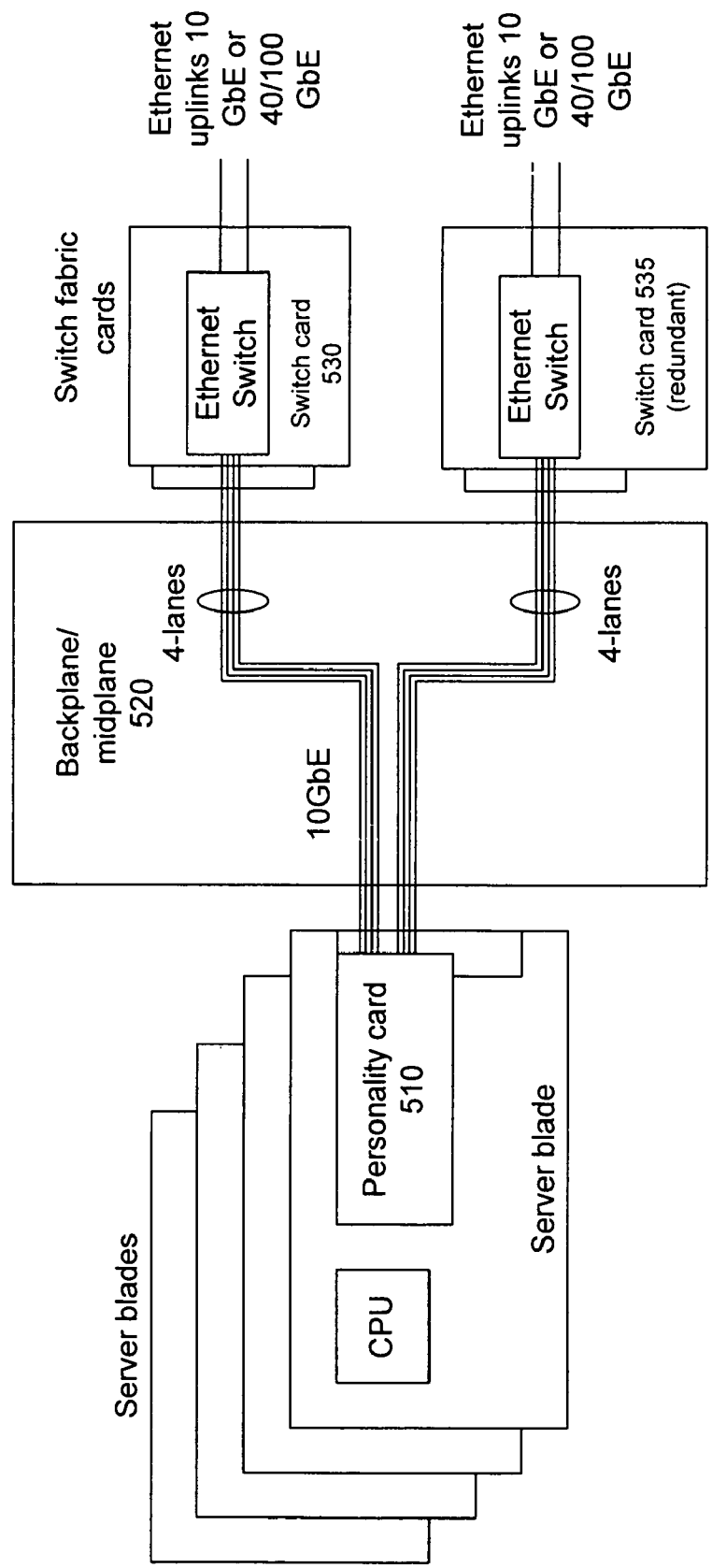
FIG. 5 depicts a system example in which a backplane having multiple lanes communicatively couples server blades and switch fabric, in accordance with an embodiment.

FIG. 5 depicts a system example in which a backplane having multiple lanes communicatively couples server blades and switch fabric, in accordance with an embodiment. Personality card 510 is a replaceable pluggable card. Personality card 510 provides flexibility to change the transmission rates of a system. For example, the personality card can transmit and receive signals at least at 40 Gb/s. Backplane 520 provides communication at rates of at least at 40 Gb/s. Each lane in the backplane may provide Ethernet signal transmission rates at 10 Gb/s. Backplane 520 may use four lanes to transmit and receive at 40 Gb/s, but may support other speeds. Switch fabric cards 530 and 535 may use Ethernet switch cards that transmit and receive at least at 40 Gb/s.

Figure 6:
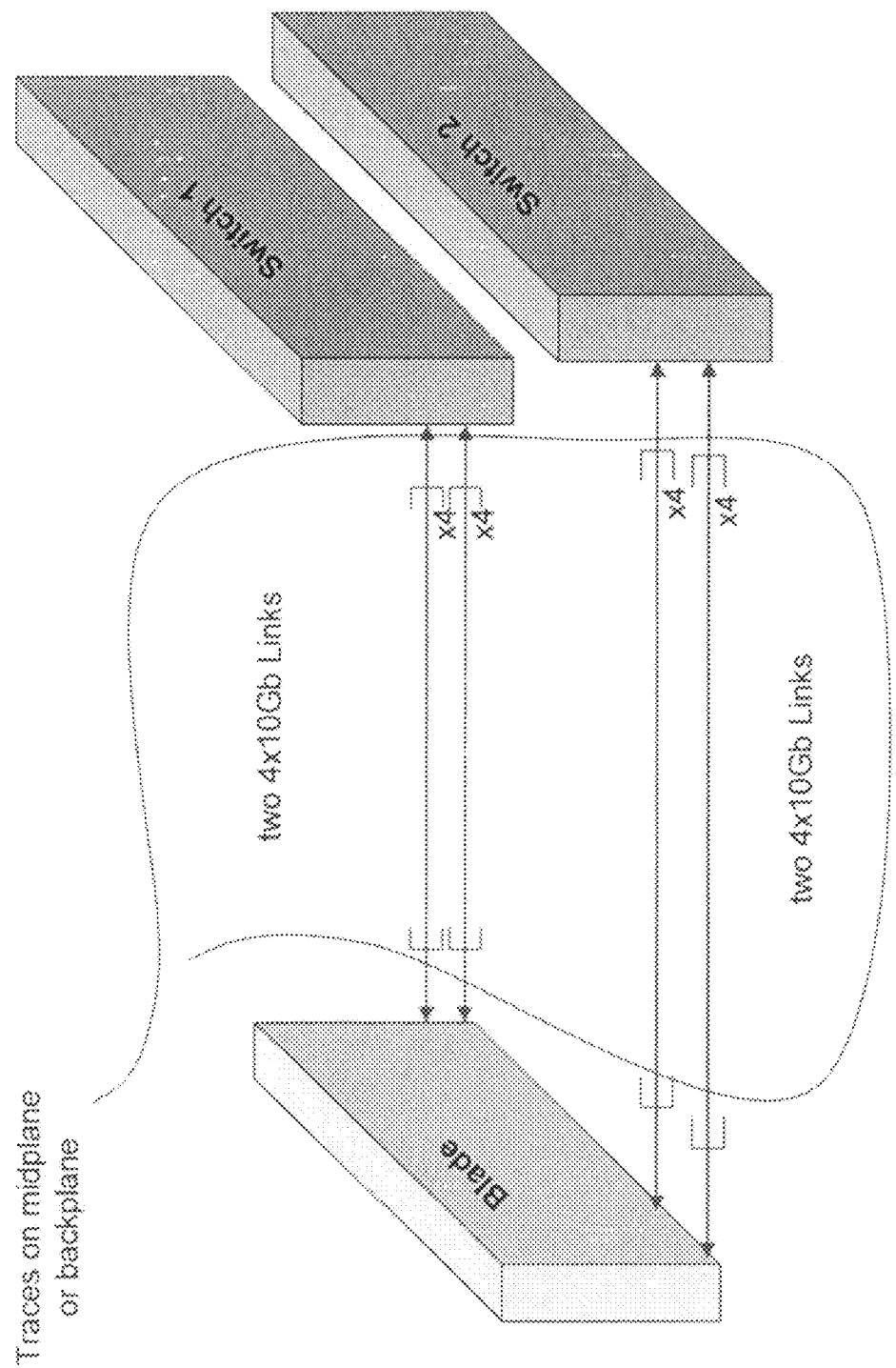
FIG. 6 depicts an example of a dual x4 fabric from a compute blade to a fabric switch.

FIG. 6 depicts an example of a dual x4 fabric from a compute blade to a fabric switch. A backplane or mid plane includes traces in the form of a pair of four 10 Gbps links. Two sets of four 10 Gbps links are used to communicatively couple the blade to each switch.

Figure 7:
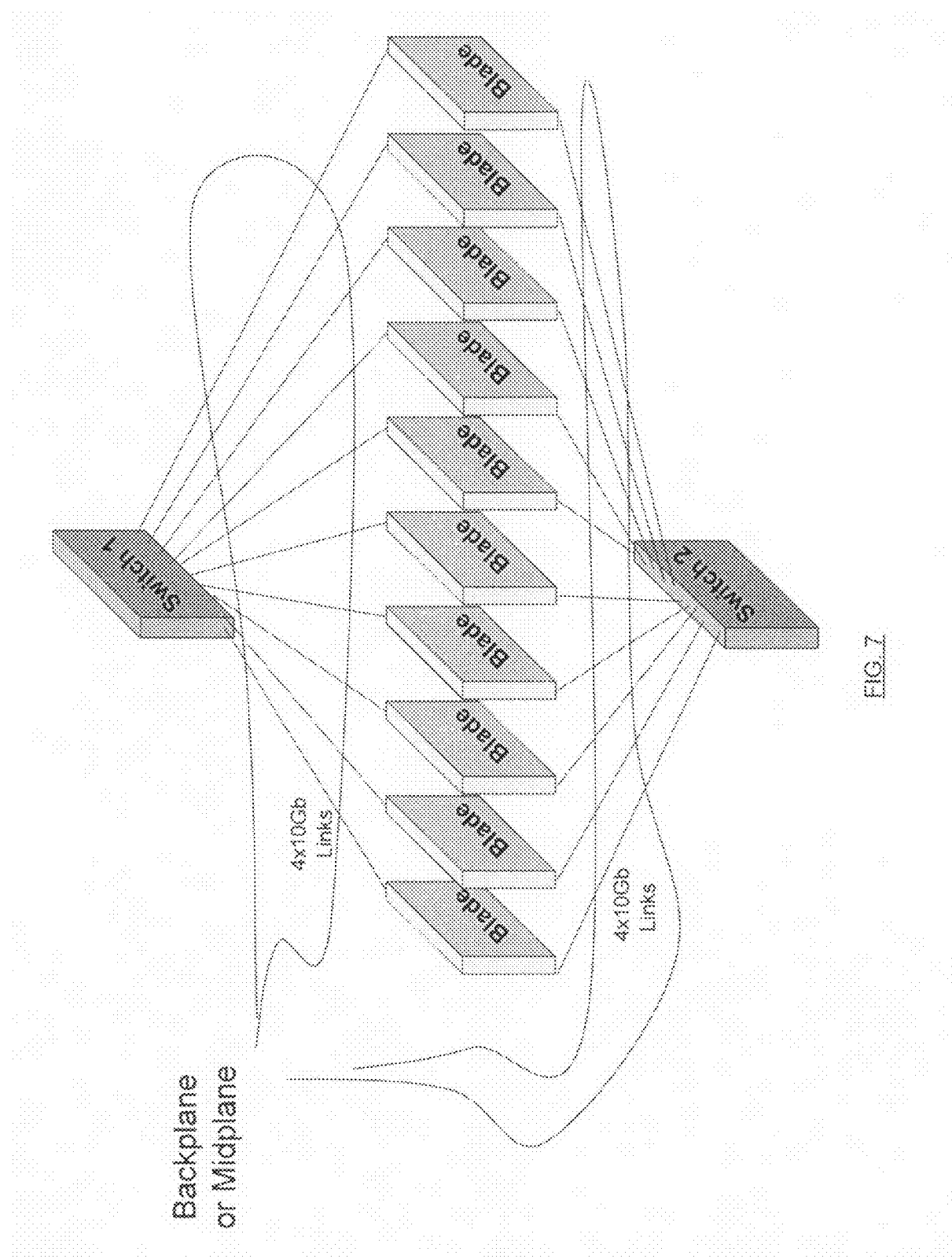
FIG. 7 depicts an example of ten blades connecting to two switches in a system.

FIG. 7 depicts an example of ten blades connecting to two switches in a system. In this example, a backplane or midplane includes traces to couple switch 1 to each of the blades. In addition, a second backplane or midplane includes traces to couple switch 2 to each of the blades. The traces that couple switch 1 and switch 2 to each of the blades are a pair of four 10 Gbps links.

Figure 8:
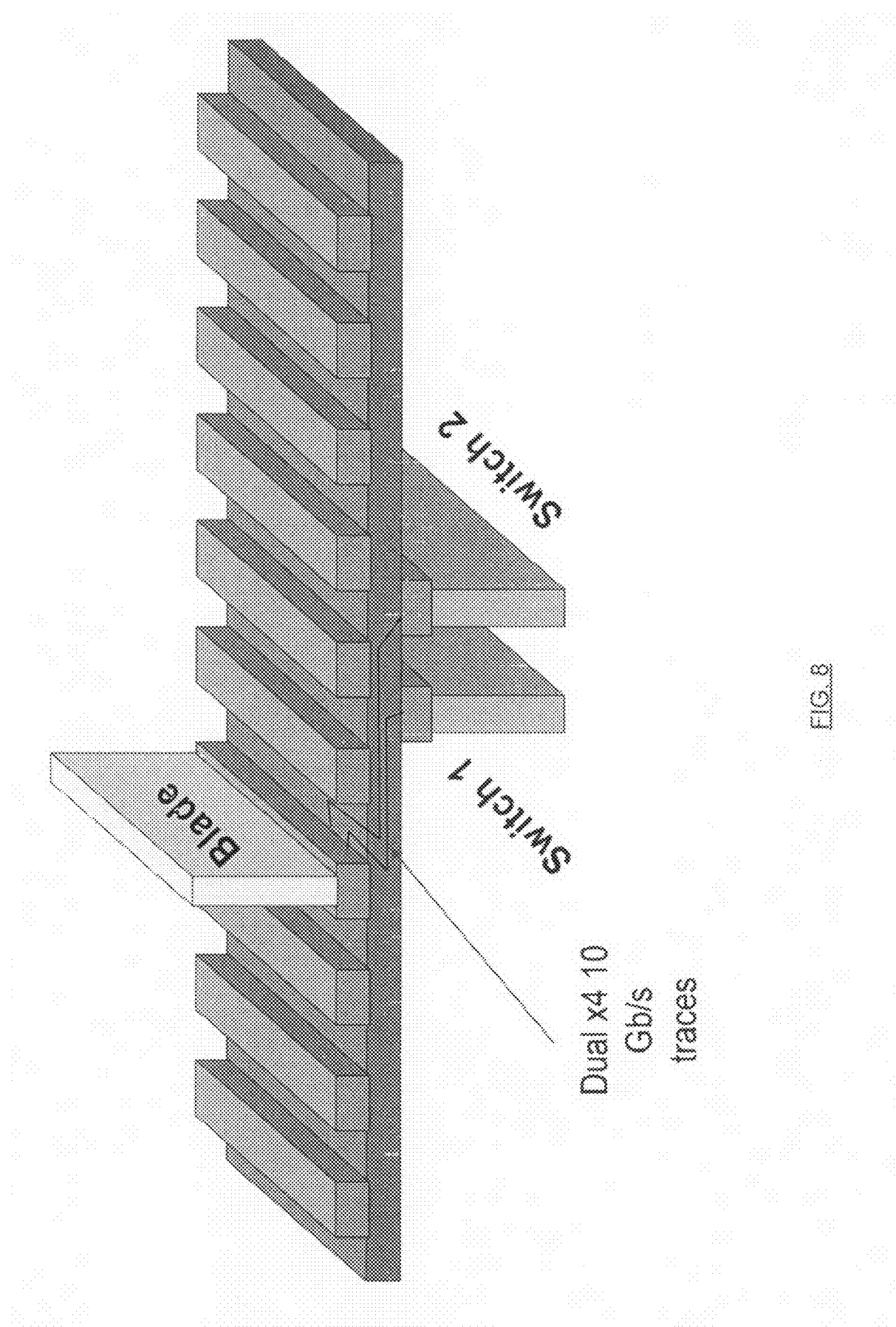
FIG. 8 depicts an example of a midplane that couples blades and switches.

FIG. 8 depicts an example of a midplane that couples blades and switches. Traces on the midplane couple the blade to switches 1 and 2. The traces that couple blade to switch 1 are a pair of four 10 Gbps links. In addition, the traces that couple the blade to switch 2 are a pair of four 10 Gbps links.

In other embodiments of the systems described with regard to FIGS. 6-8, a blade can be a line card that has multiple Ethernet ports and a switch card can be a fabric or cross bar that connects multiple line cards together. ATCA and modular switches may use this configuration. In addition, in other embodiments of the systems described with regard to FIGS. 6-8, a mesh configuration can be used where each line card has lanes connecting to each other line cards thereby forming a mesh. This configuration may be used in ATCA and modular switch systems.

Some embodiments provide proposed modifications to Clause 74 FEC of IEEE 802.3ap (2007) for multilane bit serial operation with 40 GBASE-R and 100 GBASE-R PHYs. Modifications address comment #351 on P802.3ba-D1.1.

Clause 74 FEC functional interfaces were originally defined for use with 10 GBASE-R PHYs. The 10 GBASE-R FEC service interface uses 16-bit XSBI interface as specified in clause 74.5. The FEC function operates on 64B/66B data code blocks. Hence, a reverse gearbox function defined in clause 74.7.4.1 provides functionality to adapt between the 66-bit width of the 64B/66B blocks and the 16-bit width of the FEC service interface.

In some embodiments, the reverse gearbox functionality is modified to adapt the 66-bit width of 64B/66B blocks to the multilane bit serial 40/100 GBASE-R FEC service interface or its physical instantiation of XLAUI/CAUI. Changes are suggested for the following clauses: clause 74.7.4.1 Reverse gearbox function; clause 74.7.4.3 transmission bit ordering (FIG. 74-3), clause 74.7.4.4 FEC encoding, FIG. 74-4; clause 74.7.4.5.1 FEC decoding, FIG. 74-6; clause 74.7.4.6 FEC receive bit ordering, FIG. 74-7; and clause 74.6 Delay constraints to adjust the value for 40 Gbps and 100 Gbps bit time.

Changes to clause 74.7.4.1 are as follows. The reverse gearbox function adapts between the 66-bit width of the 64B/66B blocks and the 1-bit wide lane of the 40 GBASE-R or 100 GBASE-R PCS to FEC interface. It receives the 1-bit stream from the FEC service interface and converts them back to 66-bit encoded blocks for the FEC Encoder to process. The reverse gearbox function operates in the same manner as the lane block sync function defined in 82.2.11.

The reverse gearbox function receives data via 40 GBASE-R and 100 GBASE-R FEC_UNITDATA.requestx primitive (see 74.5.2). It obtains lock to the 66-bit blocks in each bit stream using the sync headers and outputs 66-bit blocks to the FEC encoder function (see 74.7.4.4). PCS lane lock is obtained as specified in the PCS lane lock state diagram shown in FIG. 82-10.

The reverse gearbox functionality may be used when the physical instantiation of FEC service interface XLAUI/CAUI is implemented between the PCS and FEC functions because that interface passes data via bit serial 4 or 10 lanes. When the XLAUI/CAUI is not implemented, the internal data-path width between the PCS and FEC is an implementation choice. Depending on the path width, the reverse gearbox function may not be necessary.

Figure 9:
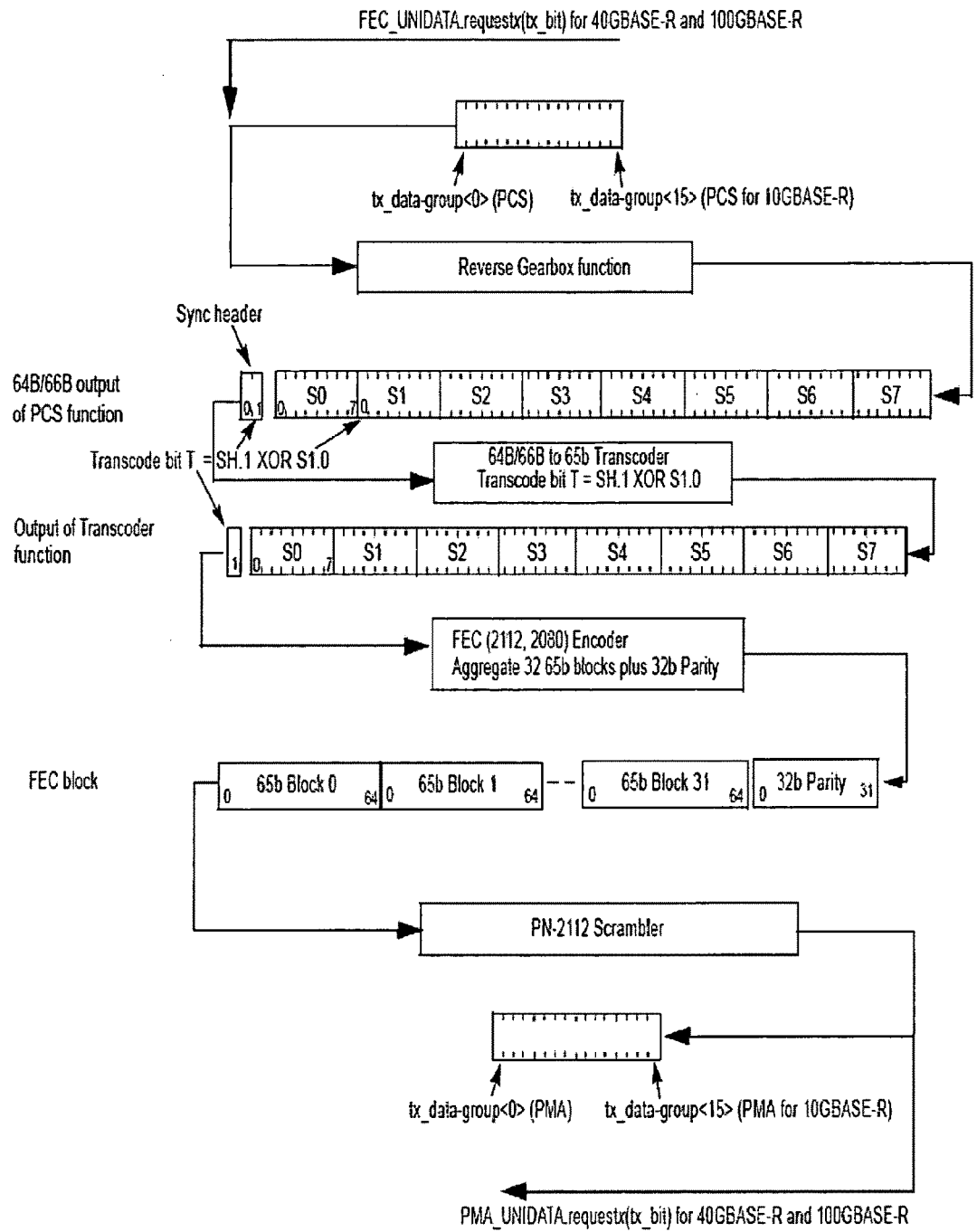
FIG. 9 depicts a replacement to FIG. 74-3—FEC Transmit Bit Ordering of clause 74.7.4.3, in accordance with an embodiment.

FIG. 9 depicts a replacement to FIG. 74-3—FEC Transmit Bit Ordering of clause 74.7.4.3, in accordance with an embodiment.

Figure 10:
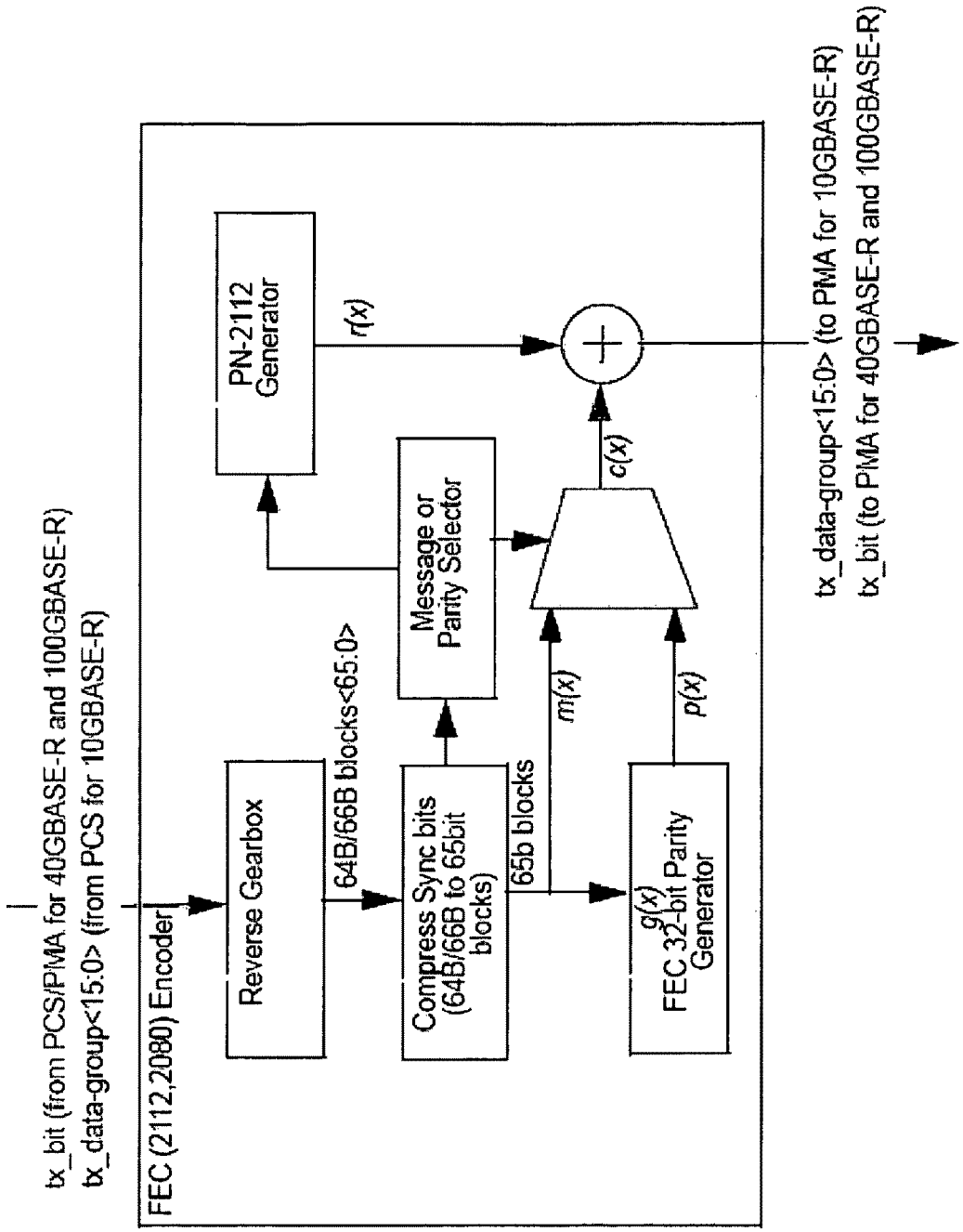
FIG. 10 depicts a replacement to FIG. 74-4—FEC (2112, 2080) encoding of clause 74.7.4.4, in accordance with an embodiment.

FIG. 10 depicts a replacement to FIG. 74-4—FEC (2112, 2080) encoding of clause 74.7.4.4, in accordance with an embodiment.

Figure 11:
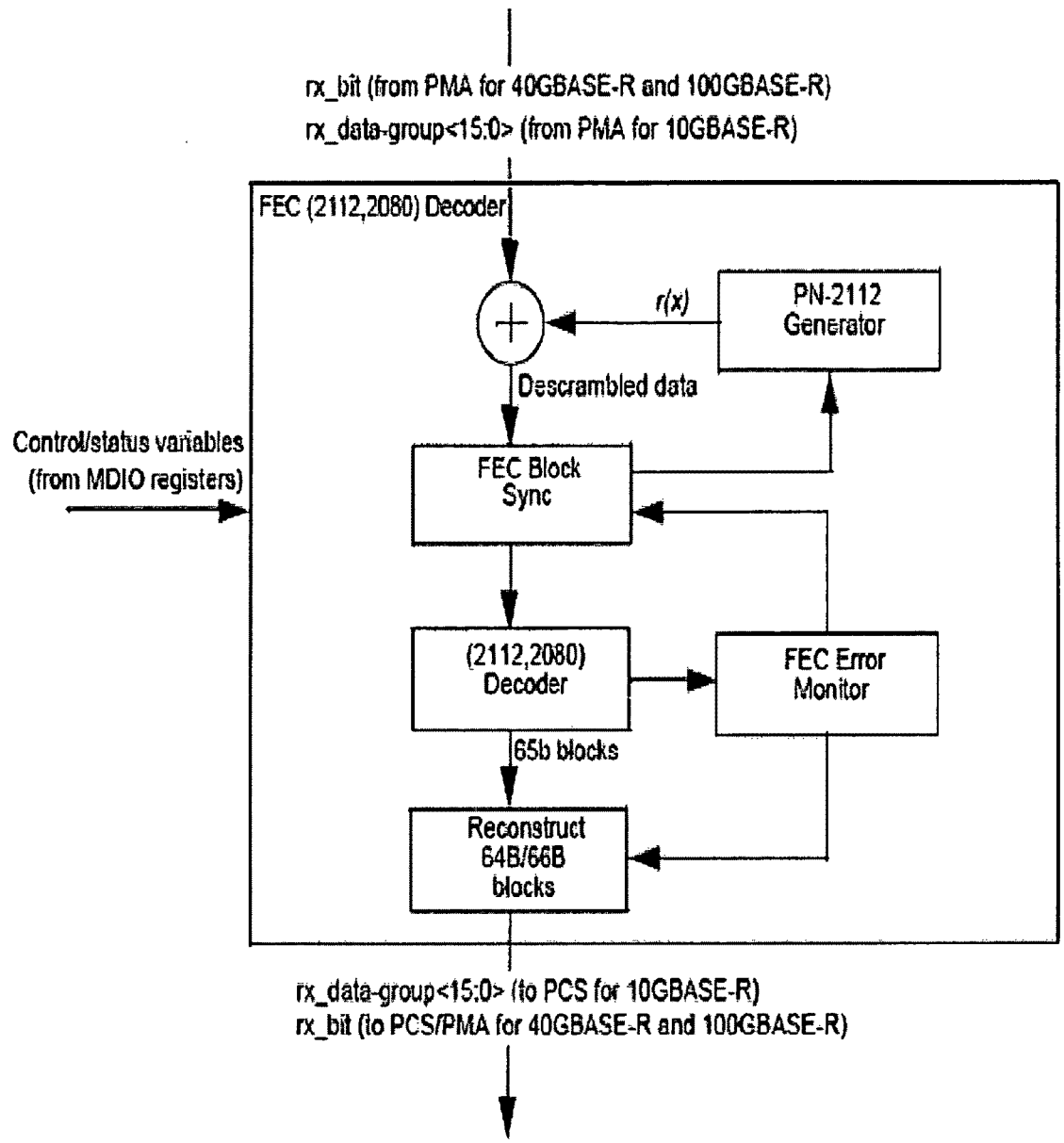
FIG. 11 depicts a replacement to FIG. 74-6—FEC (2112, 2080) decoding of clause 74.7.4.5.1, in accordance with an embodiment.

FIG. 11 depicts a replacement to FIG. 74-6—FEC (2112, 2080) decoding of clause 74.7.4.5.1, in accordance with an embodiment.

Figure 12:
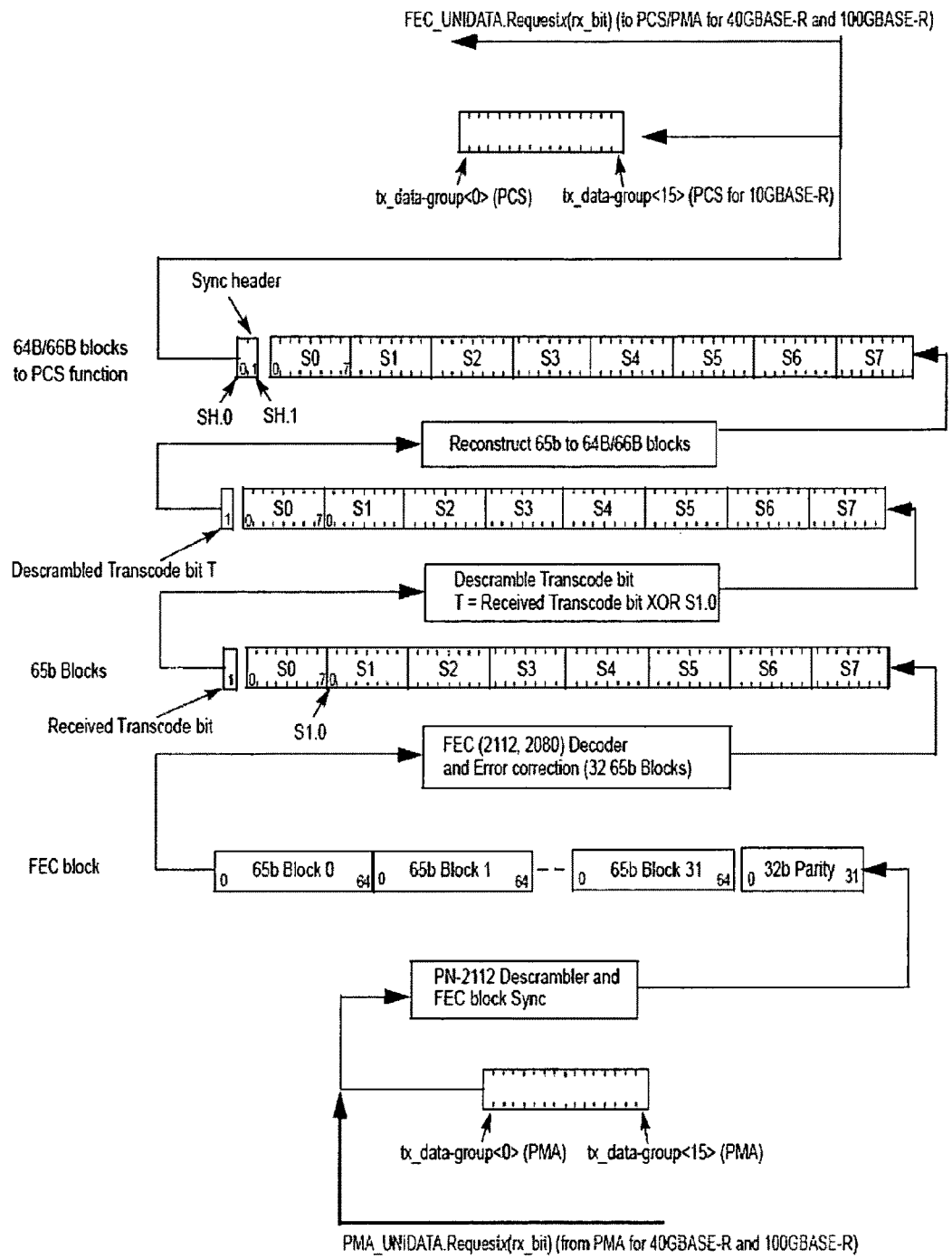
FIG. 12 depicts a replacement to FIG. 74-7—FEC Receive bit ordering of clause 74.7.4.6, in accordance with an embodiment.

FIG. 12 depicts a replacement to FIG. 74-7—FEC Receive bit ordering of clause 74.7.4.6, in accordance with an embodiment.

In some embodiments, clause 74.6 is modified so that the sum of transmit and receive delay contributed by the 40 GBASE-R FEC shall be no more than 24576 BT and the sum of transmit and receive delay contributed by the 100 GBASE-R FEC shall be no more than 61440×2 BT.

Embodiments of the present invention may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments of the present invention. A machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

The drawings and the forgoing description gave examples of the present invention. Although depicted as a number of disparate functional items, those skilled in the art will appreciate that one or more of such elements may well be combined into single functional elements. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A system comprising:
   a backplane comprising at least two lanes, wherein each lane comprises at least two pairs of differential traces on a printed circuit board and a connector coupled to transmit signals to each of the pairs, wherein each of the lanes is to transmit electrical signals, wherein electrical characteristics of each of the lanes is to comply in part with clause 72 of IEEE 802.3ap (2007);
   at least two receivers;
   at least two transmitters; and
   logic to form a signal, wherein to form a signal, the logic is to combine contents of signals received by the receivers from the lanes, wherein
      each of the at least two transmitters is associated with a receiver,
      the backplane is to communicatively couple a transmitter to an associated receiver using a lane,
      each transmitter is to transmit signals to an associated receiver, each transmitter comprises:
   forward error correction (FEC) encoder logic to encode signals with forward error correction, and
   FEC decoder logic to decode received signals and to indicate error more often than every eighth sync bit, and
   an aggregate transmission rate of the signals transmitted over the multiple lanes is approximately a number of lanes times a transmission rate of 10GBASE-KR in IEEE 802.3ap (2007).

2. The system of claim 1, further comprising a line card and wherein the line card comprises at least one of the at least two transmitters and at least one of the at least two receivers.

3. The system of claim 1, wherein each transmitter comprises logic to independently train an associated receiver using a PRBS11 training pattern, wherein each training pattern used on a lane is random with respect to patterns used on other lanes and further comprises logic to report a link as trained in response to all lanes being successfully trained.

4. The system of claim 1, wherein each of the transmitters further comprises:
   logic to indicate an ability to transmit at 40 Gb/s over backplane using a technology bit A3 and
   logic to auto-negotiate a transmission rate at any speed selected from a group consisting of 1 Gb/s, 10 Gb/s, and 40 Gb/s.

5. The system of claim 1, wherein each of the receivers further comprises:
   logic to negotiate forward error correction on a single lane and
   logic to apply the negotiated forward error correction to signals received on all lanes.

6. The system of claim 1, wherein each of the receivers further comprises:
   logic to receive multiple signals over multiple lanes, wherein the multiple signals include FEC frame markers and
   logic to use FEC frame markers on each of the lanes to align data on all of the lanes.

7. The system of claim 1, wherein each of the receivers further comprises:
   a decoupling capacitor to decouple a receiver from a corresponding transmitter.

8. The system of claim 1, wherein the signals transmitted over each of the lanes include differential NRZ signals.

9. The system of claim 1, further comprising:
   a first integrated circuit including a media access controller (MAC);
   a second integrated circuit including a PHY; and
   an XLAUI interface to communicatively couple the first integrated circuit to the second integrated circuit.

10. The system of claim 1, further comprising:
   an integrated circuit including a MAC and a PHY and
   an XLAUI interface to communicatively couple the MAC and PHY within the integrated circuit.

11. The system of claim 1, wherein for 40 Gbps transmission, each lane of four lanes is to carry transmit and receive bit streams tx_bit<0:3> and rx_bit<0:3>.

12. The system of claim 1, wherein a startup protocol per lane, signaling speed, and test methodology and procedures of the traces are to comply with clause 72 and annex 69A of IEEE standard 802.3ap (2007).

13. A method comprising:
   receiving a source signal;
   providing signals based on the source signal for transmission over multiple lanes of a backplane;
   transmitting the signals over the multiple lanes, wherein transmitting over each of the multiple lanes complies with 10GBASE-KR of IEEE 802.3ap (2007), wherein an aggregate transmission rate of the signals transmitted over the multiple lanes is approximately a number of lanes times a transmission rate of 10GBASE-KR of IEEE 802.3ap (2007);
   independently training each transmitter associated with each of the lanes using a PRBS11 training pattern, wherein a training pattern used for each lane is random with respect to training patterns used on other lanes; and
   indicating a global link signal detect after completion of training on all lanes.

14. The method of claim 13, further comprising:
   indicating an ability to transmit at 40 Gb/s using a technology bit A3.

15. The method of claim 13, further comprising:
   auto-negotiating a transmission rate at any speed selected from a group consisting of 1 Gb/s, 10 Gb/s, and 40 Gb/s.

16. The method of claim 13, further comprising:
   negotiating forward error correction on a single lane and applying the negotiated forward error correction to all lanes.

17. The method of claim 13, further comprising:
   receiving the si1gnals over the multiple lanes, wherein the signals include FEC frame markers and
   using FEC frame markers on each of the lanes to align data on all of the lanes.

18. A method comprising:
   providing communicative coupling to lanes, wherein the providing communicative coupling to lanes comprises receiving signals transmitted over the lanes, wherein electrical characteristics of each of the lanes comply in part with clause 72 of IEEE 802.3ap (2007) and wherein an aggregate transmission rate of the signals received from the lanes is approximately a number of lanes times a transmission rate of 10GBASE-KR in IEEE 802.3ap (2007);
   decoding the received signals from the lanes, the signals encoded using forward error correction (FEC); and
   in response to detecting error based on the decoding, indicating error more often than every eighth sync bit.

19. The method of claim 18, further comprising:
   negotiating forward error correction on a single lane and applying the negotiated forward error correction to signals received on all lanes.

20. The method of claim 18, further comprising:
   receiving signals over multiple lanes, wherein the received signals include FEC frame markers and
   using FEC frame markers on each of the lanes to align data on all of the lanes.

21. The method of claim 18, wherein the signals transmitted over each of the lanes include differential NRZ signals.

22. The method of claim 18, wherein a startup protocol per lane, signaling speed, and test methodology and procedures comply with clause 72 and annex 69A of IEEE standard 802.3ap (2007).

23. An apparatus comprising:
   a connector to provide communicative coupling with multiple lanes in response to coupling with the multiple lanes and to receive signals transmitted using the lanes, wherein the connector is to receive signals transmitted over the lanes, wherein electrical characteristics of each of the lanes is to comply in part with clause 72 of IEEE 802.3ap (2007) and wherein an aggregate transmission rate of the signals received from the lanes is approximately a number of lanes times a transmission rate of 10GBASE-KR in IEEE 802.3ap (2007) and a forward error correction (FEC) decoder to decode received signals from the lanes and, in response to detection of error by the FEC decoder, to indicate error more often than every eighth sync bit.

24. The apparatus of claim 23, further comprising a line card that comprises the connector and FEC decoder logic.

25. The apparatus of claim 23, further comprising:
logic to negotiate forward error correction on a single lane and
logic to apply the negotiated forward error correction to signals received on all lanes.

26. The apparatus of claim 23, further comprising:
logic to receive multiple signals over multiple lanes, wherein the multiple signals include FEC frame markers and
logic to use FEC frame markers on each of the lanes to align data on all of the lanes.

27. The apparatus of claim 23, further comprising:
a decoupling capacitor to decouple a receiver from a corresponding transmitter.

28. An apparatus comprising:
a connector to provide communicative coupling with multiple lanes of a backplane in response to coupling with the multiple lanes;
at least one trainer configured to:
independently train a transmitter associated with one lane using a PRBS 11 training pattern, wherein a training pattern used for each lane is random with respect to training patterns used on other lanes and
indicate a global link signal detect after completion of training on all lanes; and
a transmitter to cause transmission of signals over the multiple lanes, wherein:
the signals are based on a source signal and
an aggregate transmission rate of the signals transmitted over the multiple lanes is approximately a number of lanes times a transmission rate of 10GBASE-KR of IEEE 802.3ap (2007).

29. The apparatus of claim 28, wherein the transmitter is to:
indicate an ability to transmit at 40 Gb/s over backplane using a technology bit A3 and
auto-negotiate a transmission rate at any speed among at least 1 Gb/s, 10 Gb/s, and 40 Gb/s.

30. The apparatus of claim 28, wherein the signals transmitted over each of the lanes include differential NRZ signals.

31. The apparatus of claim 28, further comprising:
a first integrated circuit including a media access controller (MAC);
a second integrated circuit including a PHY; and
an XLAUI interface to communicatively couple the first integrated circuit to the second integrated circuit.

32. The apparatus of claim 28, further comprising:
an integrated circuit including a MAC and a PHY and
an XLAUI interface to communicatively couple the MAC and PHY within the integrated circuit.

* * * * *